United States Patent
Kang

(10) Patent No.: US 7,607,222 B2
(45) Date of Patent: Oct. 27, 2009

(54) METHOD OF MANUFACTURING AN ELECTRONIC COMPONENT PACKAGE

(75) Inventor: Myung-Sam Kang, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 95 days.

(21) Appl. No.: 11/708,567

(22) Filed: Feb. 21, 2007

(65) Prior Publication Data

US 2007/0278651 A1    Dec. 6, 2007

(30) Foreign Application Priority Data

Jun. 2, 2006   (KR) .................. 10-2006-0050015

(51) Int. Cl.
H05K 3/34  (2006.01)
H01L 21/00  (2006.01)

(52) U.S. Cl. .................. 29/840; 29/830; 29/832; 438/106

(58) Field of Classification Search .................. 29/825, 29/830, 832, 840; 438/106
See application file for complete search history.

(56) References Cited

U.S. PATENT DOCUMENTS

| | | | | |
|---|---|---|---|---|
| 6,897,096 B2 * | 5/2005 | Cobbley et al. | ............. | 438/123 |
| 6,964,201 B2 * | 11/2005 | Xu et al. | .................. | 73/794 |
| 7,018,866 B2 * | 3/2006 | Sugaya et al. | ............... | 438/108 |
| 7,169,652 B2 * | 1/2007 | Kimura | .................. | 438/149 |
| 7,351,608 B1 * | 4/2008 | Mountain | ............. | 438/106 |
| 2005/0116299 A1 | 6/2005 | Koning et al. | | |

OTHER PUBLICATIONS

Chinese Patent Office Action, mailed Aug. 8, 2008 and issued in corresponding Chinese Patent Application No. 200710086740.1.

\* cited by examiner

*Primary Examiner*—C. J Arbes

(57) ABSTRACT

An electronic component package and a manufacturing method thereof are disclosed. A method of manufacturing an electronic component package, which includes: forming a protrusion part on a first carrier board; stacking an insulation layer on the first carrier board and forming a circuit pattern, which includes a bonding pad and a solder ball pad, on the surface of the insulation layer; mounting an electronic component on the surface of the insulation layer and electrically connecting the electronic component and the bonding pad; and removing the first carrier board and the protrusion part, allows the mounting of the electronic component with just a single circuit pattern layer.

6 Claims, 8 Drawing Sheets

METHOD OF MANUFACTURING AN ELECTRONIC COMPONENT PACKAGE

CROSS-REFERENCE TO RELATED APPLICATIONS

This application claims the benefit of Korean Patent Application No. 10-2006-0050015 filed with the Korean Intellectual Property Office on Jun. 2, 2006, the disclosure of which is incorporated herein by reference in its entirety.

BACKGROUND

1. Technical Field

The present invention relates to an electronic component package and a manufacturing method thereof.

2. Description of the Related Art

With advances in the electronics industry, there is a rapid increase in the use of electronic component packages, which are electronic devices equipped with electronic components. Accordingly, there is an increase in the number of companies that manufacture and supply these electronic component packages, as well as companies that are expanding their business with regards electronic component packages. These market conditions have intensified competition in the pricing of electronic component packages, whereby the prices of electronic component packages are gradually decreasing, and there are several proposals being made for ways to reduce costs.

At present, most electronic component packages are implemented, as in FIGS. 1a and 1b, by the method of connecting an electronic component (memory chip) using wire bonding to a substrate to provide a package, where this board is referred to as a BOC (Board-on-Chip). A BOC is a board specially developed for the properties of the electronic component, with the pad of the electronic component positioned in the center and with a structure allowing direct connection from the pad to the board for increased signal processing speed. In order to attach the electronic component at the bottom of the board and directly connect the pad to the board, a slot is formed in the portion where the pad is positioned through which the wire bonding may be implemented. Thus, only one layer is needed for the metal layer of the board, which enables a low manufacturing cost and provides an advantage in the price competitiveness of the electronic component package.

However, with the highly rapid development of semiconductor manufacturing technology, the capacity of the electronic component package has also increased. Due to these developments in technology, there have been cases of signal loss at the wires when using a conventional BOC.

SUMMARY

An aspect of the present invention is to provide an electronic component package and manufacturing method thereof, with which a high-capacity electronic component can be installed on a single metal layer.

One aspect of the invention provides a method of manufacturing an electronic component package, which includes: forming a protrusion part on a first carrier board; stacking an insulation layer on the first carrier board and forming a circuit pattern, which includes a bonding pad and a solder ball pad, on the surface of the insulation layer; mounting an electronic component on the surface of the insulation layer and electrically connecting the electronic component and the bonding pad; and removing the first carrier board and the protrusion part. This electronic component package allows the mounting of the electronic component with just a single circuit pattern layer.

The method may further include removing a portion of the insulation layer to expose the solder ball pad, after the operation of removing the first carrier board and the protrusion part. The solder ball pad is the portion where a solder ball is to be attached, and thus it may be exposed to the exterior.

It may be advantageous for the operation of forming a protrusion part to include: stacking a seed layer on the first carrier board; stacking a dry film on the seed layer; and removing a portion of the dry film to form the protrusion part.

Also, the operation of forming a protrusion part may include attaching two of the first carrier boards such that the first carrier boards face opposite directions, and the operation of removing a portion of the dry film may include forming the protrusion part on each of the two first carrier boards. By using two first carrier boards, the efficiency of the process may be increased.

The operation of stacking an insulation layer and forming a circuit pattern may include: stacking a seed layer on a second carrier board; forming the circuit pattern on the seed layer; stacking the second carrier board on the insulation layer such that the circuit pattern faces the insulation layer; removing the second carrier board; and removing the seed layer.

Also, the method may further include the operations of stacking a dry film on the seed layer and removing a portion of the dry film to expose the seed layer on the side of the bonding pad; removing the seed layer around the bonding pad; and surface-treating the bonding pad by supplying a voltage to the remaining seed layer, between the operation of removing the second carrier board and the operation of removing the seed layer. This is a method of performing surface-treatment utilizing the seed layer as a lead wire.

Another aspect of the invention provides an electronic component package, which includes: an insulation layer; a single layer of circuit pattern buried in the insulation layer, which includes a bonding pad and a solder ball pad, and which has a surface exposed at one side of the insulation layer; and an electronic component mounted on one side of the insulation layer and electrically connected with the bonding pad. In this package, an electronic component is mounted with just a single circuit pattern layer.

Meanwhile, it may be desirable that a portion of the insulation layer be removed in correspondence with the position of the solder ball pad, such that the solder ball pad is exposed at the other side of the insulation layer. The solder ball pad becomes the point where a solder ball is attached.

Additional aspects and advantages of the invention will become apparent and more readily appreciated from the following description, including the appended drawings and claims, or may be learned by practice of the invention.

DETAILED DESCRIPTION

Embodiments of the invention will be described below in more detail with reference to the accompanying drawings. In the description with reference to the accompanying drawings, those components are rendered the same reference number that are the same or are in correspondence, regardless of the figure number, and redundant explanations are omitted.

Figure 1A:
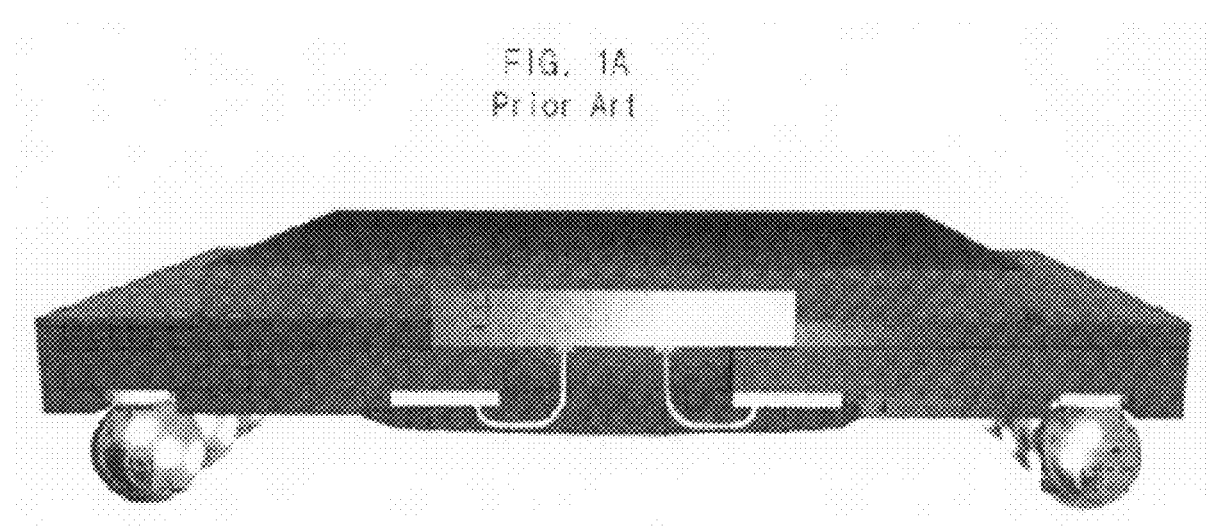
FIG. 1a is a perspective view of an electronic component package according to prior art.
Figure 1B:
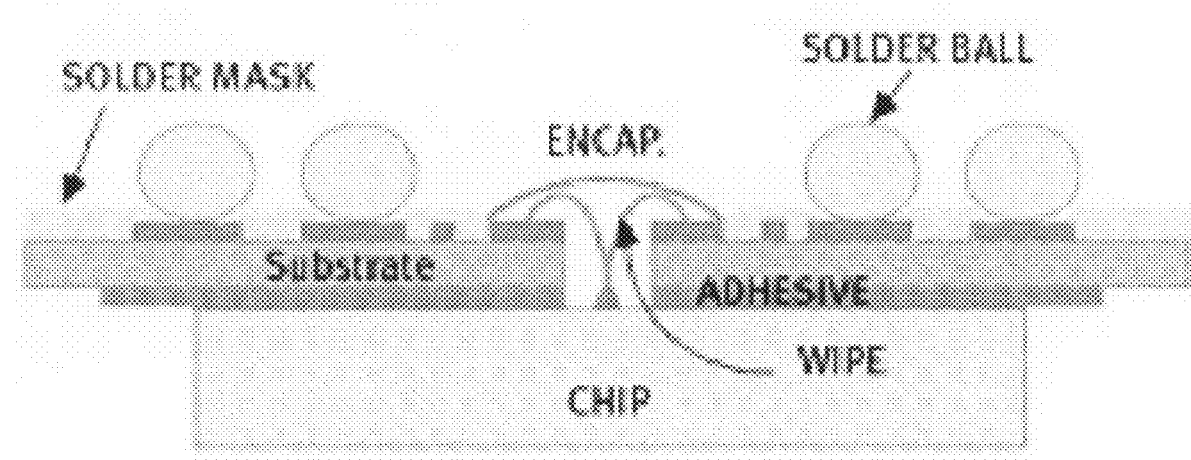
FIG. 1b is a cross-sectional view of an electronic component package according to prior art.
Figure 2:
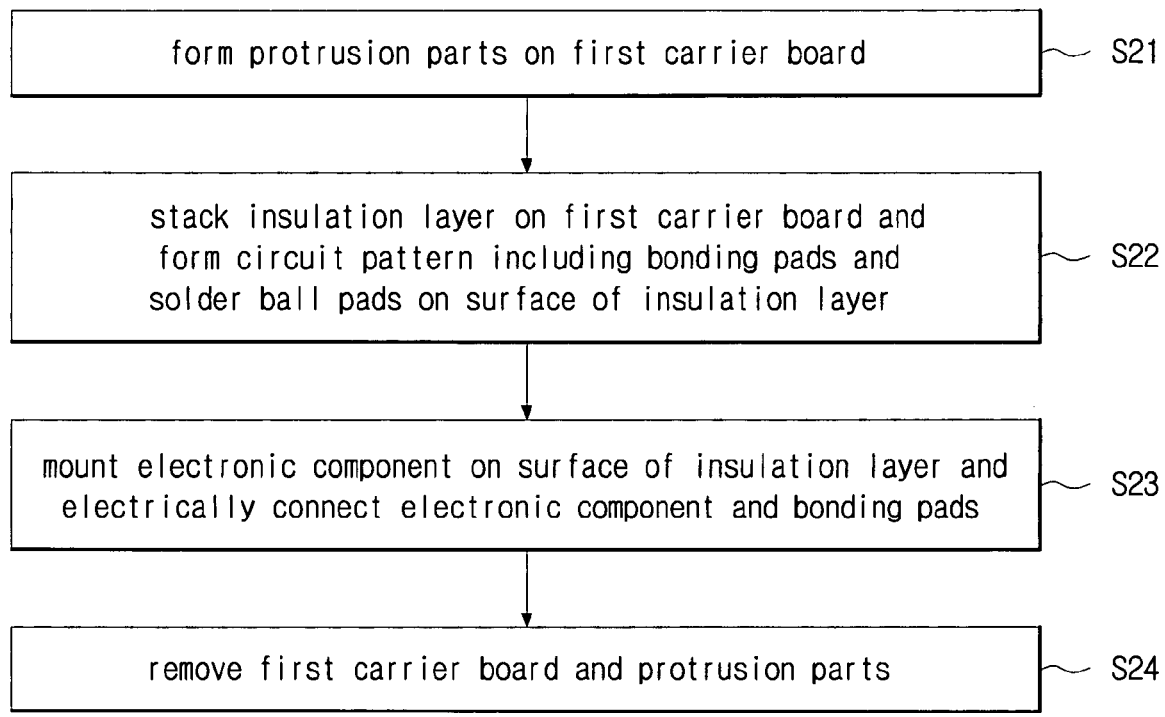
FIG. 2 is a flowchart of a method of manufacturing an electronic component package according to a first disclosed embodiment of the invention.
Figure 3:
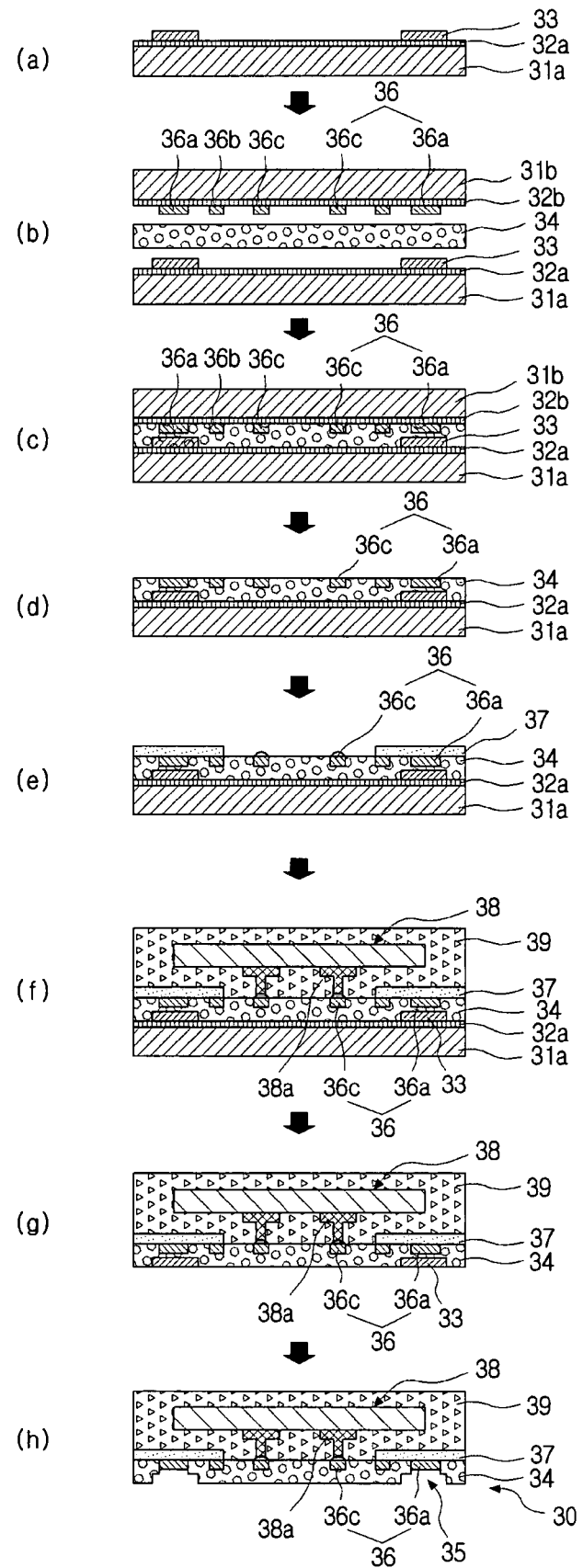
FIG. 3 is a process diagram of a method of manufacturing an electronic component package according to a first disclosed embodiment of the invention.

FIG. 2 is a flowchart of a method of manufacturing an electronic component package according to a first disclosed embodiment of the invention, and FIG. 3 is a process diagram of a method of manufacturing an electronic component package according to a first disclosed embodiment of the invention. In FIG. 3 are illustrated an electronic component package 30, a first carrier board 31a, a second carrier board 31b, seed layers 32a, 32b, protrusion parts 33, an insulation layer 34, holes 35, solder ball pads 36a, a circuit pattern 36, bonding pads 36c, solder resist 37, an electronic component 38, chip pads 38a, and mold material 39.

S21 of FIG. 2 is an operation of forming protrusion parts on a first carrier board, the corresponding process of which is shown in (a) of FIG. 3. The operation of forming the protrusion parts 33 on the first carrier board 31a can be divided into an operation of preparing a flat first carrier board 31a, stacking a seed layer 32a on the first carrier board 31a by electroless plating, and forming the protrusion part 33 on the surface of the seed layer 32a in correspondence with the solder ball pads 36a. The protrusion parts 33 are formed by stacking a dry film on the surface of the seed layer 32a and then removing the remaining dry film besides the protrusion parts 33, through exposure and development processes. Meanwhile, the seed layer 32a is formed so that the first carrier board 31a may be detached readily. Therefore, if the first carrier board 31a can be removed readily without an interposed seed layer 32a, the process of stacking the seed layer 32a is unnecessary.

S22 of FIG. 2 is an operation of stacking an insulation layer 34 on the first carrier board 31a, and forming a circuit pattern 36, which includes bonding pads 36c and solder ball pads 36a, on the surface of the insulation layer 34, and the corresponding processes are shown in (b) to (e) of FIG. 3. As in (b) of FIG. 3, a second carrier board 31b, on which the circuit pattern 36 including the bonding pads 36c and solder ball pads 36a are formed, is aligned with the first carrier board 31a, which was formed previously in process (a) of FIG. 3, with an insulation layer 34 interposed in-between. The aligning is such that the protrusion parts 33 of the first carrier board 31a and the circuit pattern 36 of the second carrier board 31b face each other.

Meanwhile, the circuit pattern 36 illustrated in (b) of FIG. 3 is manufactured on the surface of the second carrier board 31b using a semi-additive method. Specifically, the seed layer 32b and a dry film are stacked in order on the surface of the second carrier board 31b. Afterwards, exposure and development processes are performed to remove portions of the dry film where the circuit pattern 36 is to be formed. Then, plating the removed portions and removing the remaining dry film results in the circuit pattern 36 formed on the surface of the second carrier board 31b, as illustrated in (b) of FIG. 3.

Drawing (c) of FIG. 3 shows the first carrier board 31a and second carrier board 31b stacked collectively, where the protrusion parts 33 and the circuit pattern 36 including the solder ball pads 36a and bonding pads 36c are embedded inside the insulation layer 34.

Here, the protrusion parts 33 are stacked in positions that correspond with the solder ball pads 36a. Thus, it may be desirable that the protrusion parts 33 be formed beforehand in process (a) at points that correspond with the solder ball pad 36a. Also, it may be desirable that the protrusion parts 33 be formed to have such a thickness that does not allow the insulation layer 34 to be interposed between the protrusion parts 33 and the solder ball pads 36a. Meanwhile, the material used for the insulation layer 34 is of a low hardness, so that the protrusion parts 33 may be embedded within. An example of such a material is pure resin.

Drawing (d) of FIG. 3 shows a process of removing the second carrier board 31b and the seed layer 32b. The seed layer 32b is removed by flash etching. Flash etching is an etching process performed with a lower intensity than in regular etching, for removing the thin film of seed layer. The result after the completion of this etching process is complete is as shown in (d) of FIG. 3. As in (d) of FIG. 3, the circuit pattern 36 including the solder ball pads 36a and bonding pads 36c is embedded in the insulation layer 34.

Drawing (e) of FIG. 3 shows a process of surface-treating the bonding pads 36c, in which solder resist 37 is applied on the portions except for the bonding pad 36c portions. Afterwards, a Ni layer is stacked on the bonding pads 36c by electroless plating, and gold plating is performed on the surface of the Ni layer by electroplating.

S23 of FIG. 2 is an operation of mounting an electronic component 38 on the surface of the insulation layer 34 and electrically connecting the electronic component 38 and the bonding pads 36c. The bonding pads 36c are formed in positions that correspond with the chip pads 38a of the electronic component 38, and after positioning the chip pads 38a on the surfaces of the bonding pads 36c, they are attached by flooring. Also, to protect the electronic component 38, a finishing is provided around the electronic component 38 and insulation layer 34 using a mold material 39.

S24 of FIG. 2 is an operation of removing the first carrier board 31a and protrusion parts 33, the corresponding processes of which are shown in (g) and (h) of FIG. 3.

Drawing (g) of FIG. 3 shows a process of removing the first carrier board 31a and removing the seed layer 32a. The first carrier board 31a is a sort of support, and is removed after the electronic component 38 is mounted. After the first carrier board 31a is removed, the seed layer 32a is removed. When the seed layer 32a is removed, the protrusion parts 33 are exposed. The exposed protrusion parts 33 are removed by a wet treatment.

Drawing (h) of FIG. 3 shows the form of the electronic component package 30 after the protrusion parts 33 are removed. Holes 35 are formed when the protrusion parts 33 are removed, and the solder ball pads 36a are exposed to the exterior inside the holes 35. As portions of the insulation layer 34 may remain on the solder ball pads 36a, a desmearing process may further be performed to remove these.

Figure 4:
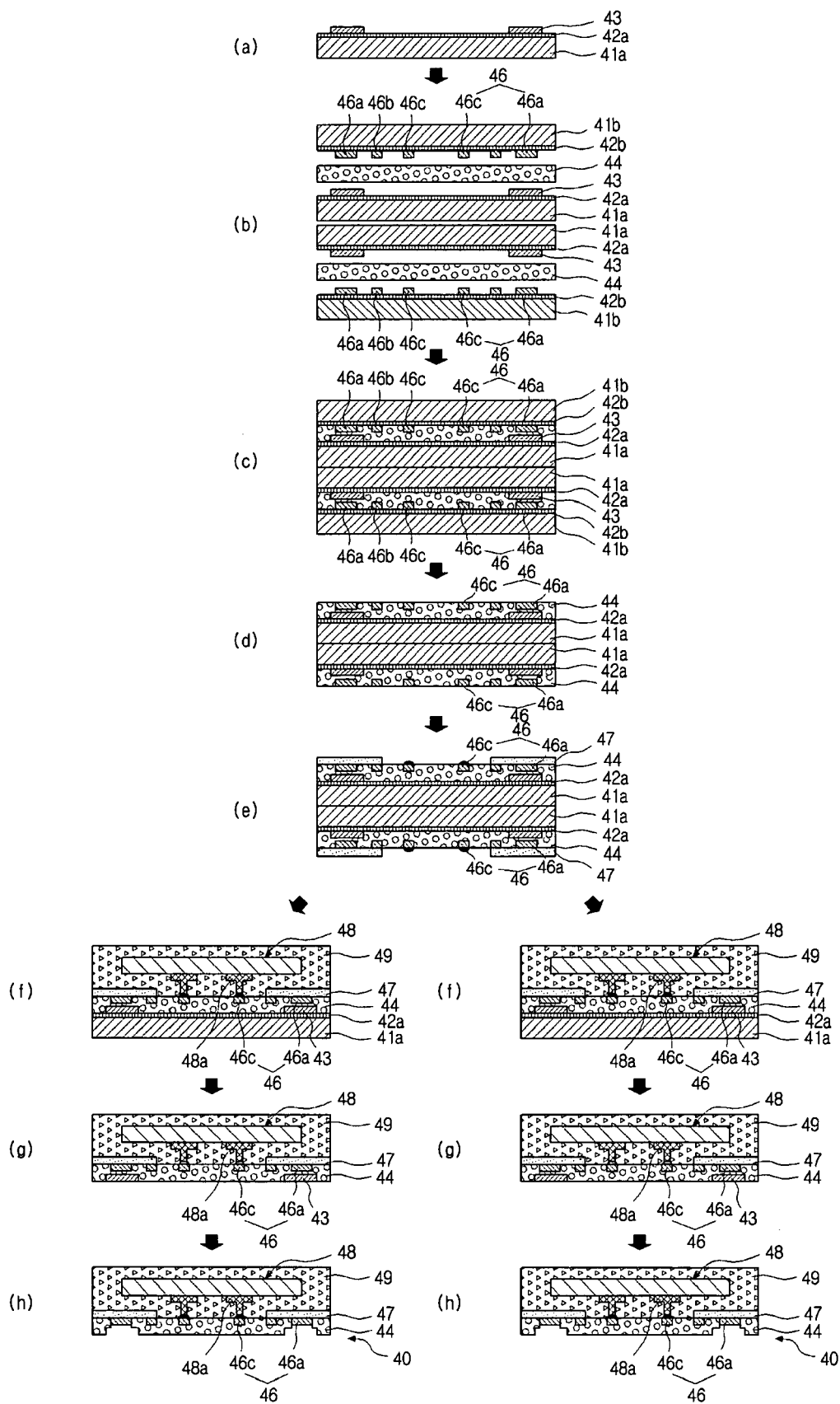
FIG. 4 is a process diagram of a method of manufacturing an electronic component package according to a second disclosed embodiment of the invention.

FIG. 4 is a process diagram of a method of manufacturing an electronic component package according to a second disclosed embodiment of the invention. In FIG. 4 are illustrated an electronic component package 40, first carrier boards 41, seed layers 42a, 42b, protrusion parts 43, insulation layers 44, solder ball pads 46a, circuit patterns 46, bonding pads 46c, solder resist 47, electronic components 48, chip pads 48a, and mold material 49. In this embodiment, the efficiency is increased in the manufacture of the electronic component packages 40, by performing the procedures with two first carrier boards 41 attached together.

Although this embodiment is generally the same as the first disclosed embodiment of FIG. 3, the memory packages 40 are manufactured with greater efficiency by proceeding with the processes with two first carrier boards 41a attached together. The following describes this embodiment with reference to the process diagram of FIG. 4.

Drawing (a) of FIG. 4 shows the same process as (a) of FIG. 3, which is a process of forming the protrusion parts 43 on the first carrier board 41a.

In (b) of FIG. 4, two first carrier boards 41a are attached facing opposite directions, such that the protrusion part 43 are exposed to the exterior, based on which the insulation layers 44 and the second carrier boards 41b, having circuit patterns 46 that include the solder ball pads 46a and bonding pads 46c, are aligned in symmetry. Thus using the two first carrier boards 41a attached together allows the processes to be performed simultaneously.

Drawing (c) of FIG. 4 shows the insulation layers 44 and second carrier boards 41b stacked symmetrically with respect to the two first carrier boards 41a attached together. The protrusion parts 43 of the first carrier boards 41a and the circuit patterns 46 of the second carrier boards 41b are embedded in the insulation layers 44. It may be desirable to use a material low in hardness for the insulation layers 44, and in this embodiment, pure resin is used.

Drawing (d) of FIG. 4 shows a process of removing the second carrier boards 41b and the seed layers 42b. As the second carrier boards 41b and seed layers 42b are removed, the circuit patterns 46 are uncovered at the surfaces of the insulation layers 44.

Drawing (e) of FIG. 4 shows a process of applying solder resist 47 on portions excluding the bonding pads 46c and afterwards surface-treating the bonding pads 46c. The bonding pads 46c are the portions that will later be attached to the chip pads 38a of the electronic components 38.

Drawing (f) of FIG. 4 shows a process of separating the two first carrier boards 41a, and mounting an electronic component 38 on the bonding pads 46c of each first carrier board 41a. While the two first carrier boards 41a are used attached together up until the process (e) of FIG. 4, the processes are performed with the first carrier boards 41a separated, starting from process (f) of FIG. 4. Drawing (f) of FIG. 4 shows a process of attaching the chip pads 38a and bonding pads 46c to be in correspondence and mounting the electronic components 38 on the surfaces of the bonding pads 46c. To protect the electronic component 38, the mold material 49 is filled around the electronic component 38. Epoxy resin is used for the mold material 49.

Descriptions for (g) and (h) of FIG. 4 will be omitted, as they are sufficiently described for the first disclosed embodiment of FIG. 3.

Figure 5:
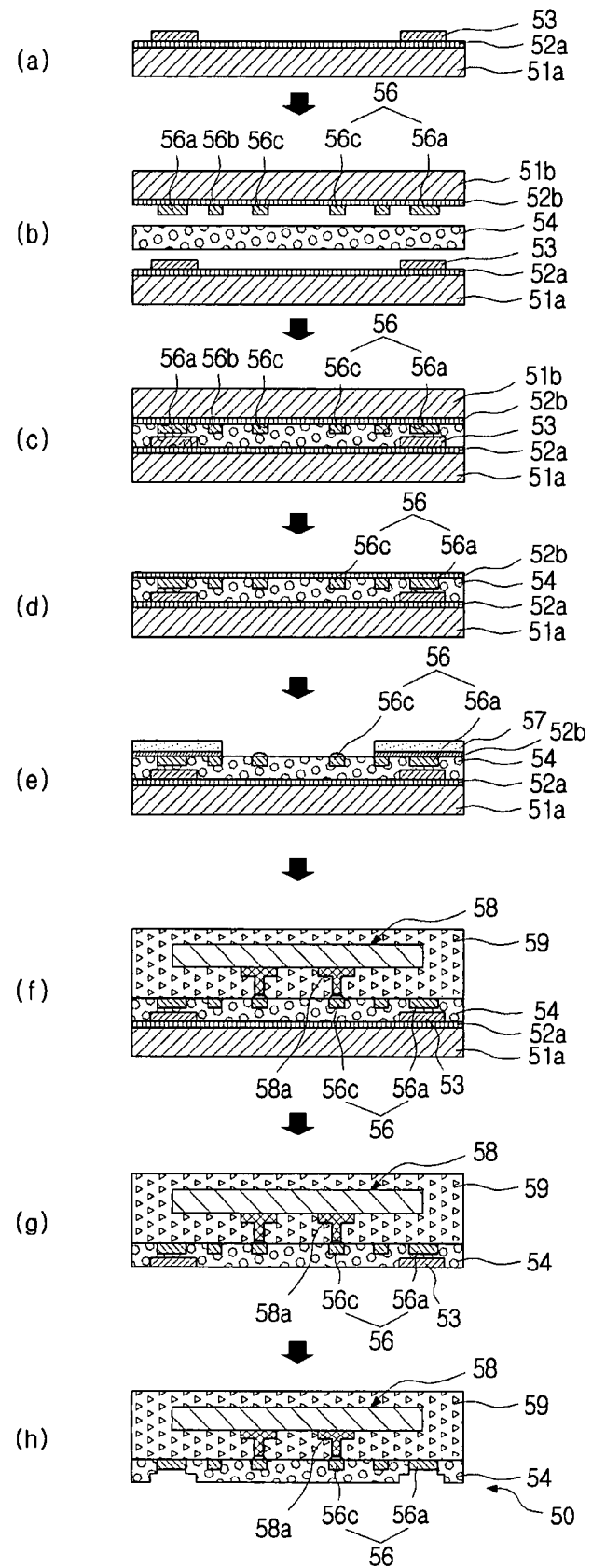
FIG. 5 is a process diagram of a method of manufacturing an electronic component package according to a third disclosed embodiment of the invention.

FIG. 5 is a process diagram of a method of manufacturing an electronic component package according to a third disclosed embodiment of the invention. In FIG. 5 are illustrated an electronic component package 50, a first carrier board 51a, a second carrier board 51b, seed layers 52a, 52b, protrusion parts 53, an insulation layer 54, solder ball pads 56a, a circuit pattern 56, bonding pads 56c, resist 57, an electronic component 58, chip pads 58a, and mold material 59.

This embodiment shows a process of performing surface-treatment on the bonding pads 56c, utilizing the seed layer 52b as a lead wire. The processes (a) to (c) of FIG. 5 are the same as the processes (a) to (c) of FIG. 3. Drawing (d) of FIG. 5 shows a process of removing the second carrier board 52b. When the second carrier board 51b is removed, the seed layer 52b is uncovered.

Drawing (e) of FIG. 5 shows a process of removing the seed layer 52b on the surface of and around the bonding pads 56c to which the surface-treatment is to be applied and stacking resist 57 on the surface of the remaining seed layer 52b. A dry film is used for the resist 57. Portions of the seed layer 52b that are not removed act as a lead wire that supplies an electrical current to the bonding pads 56c. This process utilizes the seed layer 52b as a lead wire, instead of forming a separate lead wire. The resist 57 prevents surface-treatment on portions other than the bonding pads 56c.

Drawing (f) of FIG. 5 shows a process of mounting an electronic component 58. In order to mount the electronic component 58, the seed layer 52b and resist 57 are removed in (e) of FIG. 5. Leaving the seed layer 52b may result in the circuit pattern 56 becoming electrically connected to undesired portions, and thus it may be advantageous to remove the seed layer 52b. The process of mounting the electronic component 58 after removing the seed layer 52b is the same as that for FIG. 3, and thus detailed descriptions will not be provided on this matter.

Figure 6:
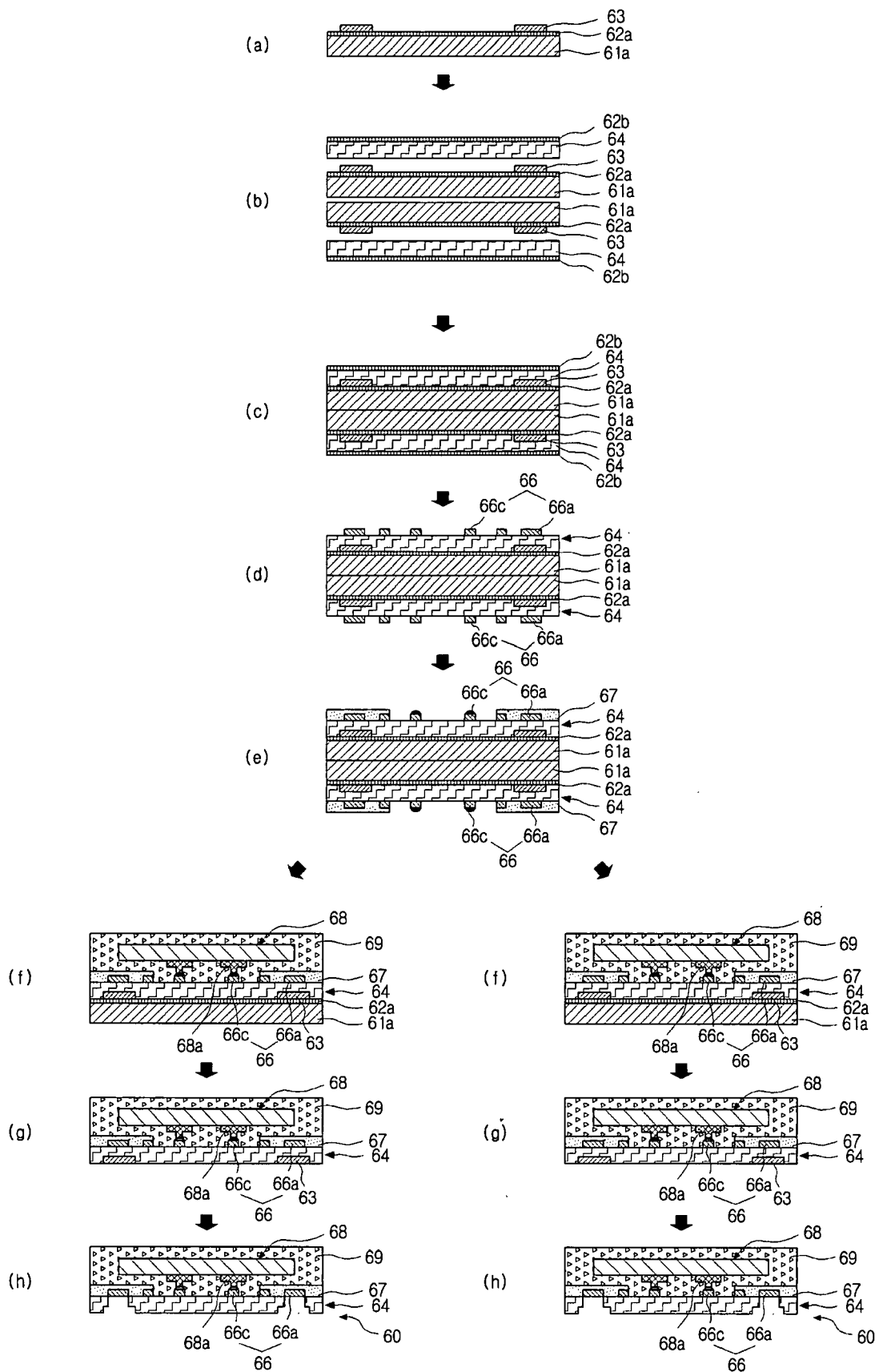
FIG. 6 is a process diagram of a method of manufacturing an electronic component package according to a fourth disclosed embodiment of the invention.

FIG. 6 is a process diagram of a method of manufacturing an electronic component package according to a fourth disclosed embodiment of the invention. In FIG. 6 are illustrated an electronic component package 60, first carrier boards 61a, seed layers 62a, copper foils 62b, protrusion parts 63, copper clad laminates 64, solder ball pads 66a, circuit patterns 66, bonding pads 66c, solder resist 67, electronic components 68, chip pads 68a, and mold material 69.

This embodiment shows a process of stacking a copper clad laminate 64 on the first carrier board 61a, and afterwards removing the copper foil 62b to form the circuit pattern 66. Looking at this embodiment with reference to FIG. 6, (a) of FIG. 6 shows the same process as (a) of FIG. 3, which is a process of forming protrusion parts 63 on the first carrier board 61a.

Drawing (b) of FIG. 6 shows a process of attaching two first carrier boards 61a such that the protrusion parts 63 face outward, and aligning the copper clad laminates 64 in symmetry. In (c) of FIG. 6, the copper clad laminates 64 and first carrier boards 61a are collectively stacked. Here, the two first carrier boards 61a are attached in consideration of the fact that they will be separated in a subsequent process.

Drawing (d) of FIG. 6 shows a process of removing portions of the copper foils 62b to form the circuit patterns 66, including the solder ball pads 66a and bonding pads 66c. Drawing (e) of FIG. 6 shows a process of performing surface-treatment on the bonding pads 66c, and drawing (f) shows a process of separating the two first carrier boards 61a and afterwards mounting the electronic components 68. The following processes are the processes of removing the first carrier boards 61a, seed layers 62a, and protrusion parts 63, as has been described for the embodiment of FIG. 3.

Figure 7:
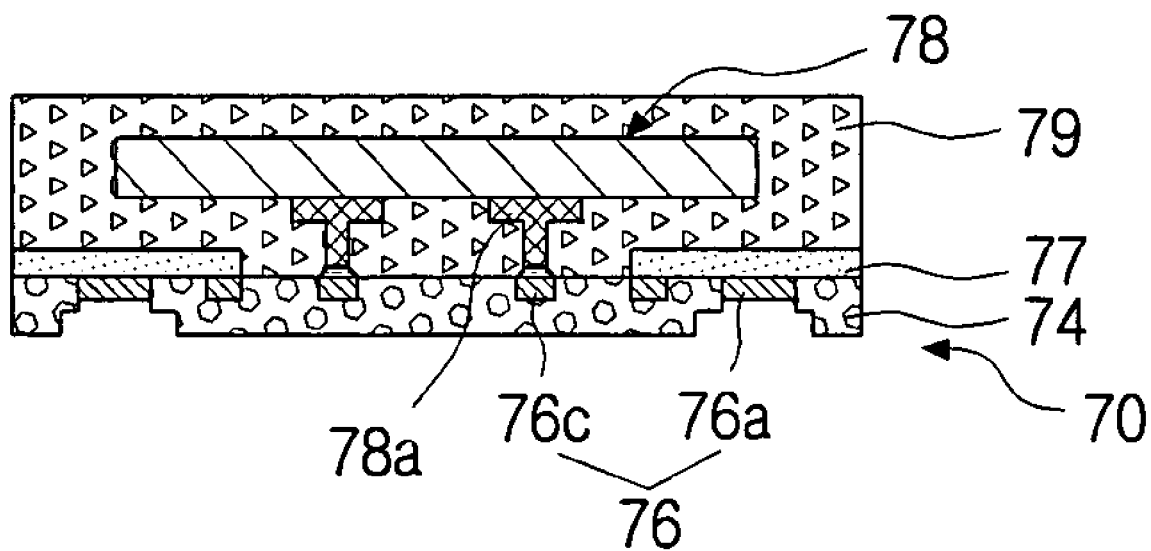
FIG. 7 is cross-sectional view of an electronic component package according to a fourth disclosed embodiment of the invention.

FIG. 7 is cross-sectional view of an electronic component package according to a fourth disclosed embodiment of the invention. In FIG. 7 are illustrated an electronic component package 70, an insulation layer 74, solder ball pads 76a, a circuit pattern 76, bonding pads 76c, solder resist 77, an electronic component 78, chip pads 78a, and mold material 79.

In this embodiment, the bonding pads 76c, which are to be electrically connected with the electronic component 78, are formed on one side of a single layer of circuit pattern 76, and the solder ball pads 76a, which are to be connected with solder balls, are formed on the other side. These solder ball pads 76a and bonding pads 76c are portions of the circuit pattern 76, and are concurrently formed when forming the circuit pattern 76.

The electronic component 78 has the form of a flip chip, with several chip pads 78a formed on the bottom surface. These chip pads 78a are formed in positions that correspond with the bonding pads 76c, and are electrically connected to each other. Meanwhile, the electronic component 78 is secured by means of the mold material 79. The solder ball pads 76a have surfaces exposed to the exterior, where surface-treatment is applied to the exposed portions. The surface-treatment is for enhancing the adhesion to the solder balls.

According the embodiments set forth above, the lengths of signal lines are shortened compared to the case of conventional electronic component packages, which allows quicker signal processing. Also, by means of the semi-additive method, it is possible to form high-density circuits. In addition, since there is no wire bonding as in prior art, it is not necessary to process holes, and as the circuit pattern is made of a single layer, a superb heat-releasing effect is obtained.

While the present invention has been described with reference to particular embodiments, it is to be appreciated that various changes and modifications may be made by those skilled in the art without departing from the spirit and scope of the present invention, as defined by the appended claims and their equivalents.

What is claimed is:

1. A method of manufacturing an electronic component package, the method comprising:
    forming a protrusion part on a first carrier board;
    stacking an insulation layer on the first carrier board and forming bonding pad and a solder ball pad on the surface of the insulation layer such that protrusion part is formed in position corresponding with the solder ball;
    mounting an electronic component on the surface of the insulation layer such that the electronic component is electronically connected with the bonding pad;
    removing the first carrier board and the protrusion part; and
    processing a lower surface of the insulation layer such that the solder ball pad is exposed.

2. The method of claim 1, wherein the electronic component is mounted on the surface of the insulation layer by a flip-chip method.

3. The method of claim 1, wherein the operation of forming a protrusion part comprises:
    forming a seed layer on the first carrier board;
    stacking a dry film on the seed layer; and
    removing a portion of the dry film to form the protrusion part.

4. The method of claim 3, wherein
    the operation of forming a protrusion part comprises attaching two of the first carrier boards such that the first carrier boards face opposite directions, and
    the operation of removing a portion of the dry film comprises forming the protrusion part on each of the two first carrier boards.

5. The method of claim 1, wherein the operation of stacking an insulation layer and forming a bonding pad and a solder ball pad comprises:
    forming a seed layer on a second carrier board;
    forming the bonding pad and the solder ball pad on the seed layer;
    stacking the second carrier board on the insulation layer such that the bonding pad and the solder pad are embedded inside the insulation layer; removing the second carrier board; and removing the seed layer.

6. The method of claim 5, further comprising:
    stacking a dry film on the seed layer and removing a portion of the dry film and the seed layer such that an upper surface of the seed layer on the side of the bonding pad is exposed; and
    surface-treating the bonding pad by supplying a voltage to the remaining seed layer,
    between the operation of removing the second carrier board and the operation of removing the seed layer.

* * * * *

UNITED STATES PATENT AND TRADEMARK OFFICE
CERTIFICATE OF CORRECTION

| | |
|---|---|
| PATENT NO. | : 7,607,222 B2 |
| APPLICATION NO. | : 11/708567 |
| DATED | : October 27, 2009 |
| INVENTOR(S) | : Kang |

It is certified that error appears in the above-identified patent and that said Letters Patent is hereby corrected as shown below:

Column 7, Line 40, change "bonding" to --a bonding--.

Signed and Sealed this

Nineteenth Day of January, 2010

David J. Kappos
*Director of the United States Patent and Trademark Office*